United States Patent
Miyake (10) Patent No.: US 9,743,531 B2
(45) Date of Patent: Aug. 22, 2017

(54) ELECTRONIC APPARATUS AND MANUFACTURING METHOD OF ELECTRONIC APPARATUS

(71) Applicant: DENSO CORPORATION, Kariya, Aichi-pref. (JP)

(72) Inventor: Toshihiro Miyake, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/163,897

(22) Filed: May 25, 2016

(65) Prior Publication Data

US 2016/0380367 A1 Dec. 29, 2016

(30) Foreign Application Priority Data

Jun. 29, 2015 (JP) .................................. 2015-130169
Dec. 7, 2015 (JP) .................................. 2015-238690

(51) Int. Cl.
*H05K 1/11* (2006.01)
*H05K 3/32* (2006.01)
(Continued)

(52) U.S. Cl.
CPC ............. *H05K 3/325* (2013.01); *H01R 13/03* (2013.01); *H05K 1/115* (2013.01); *H05K 3/308* (2013.01);
(Continued)

(58) Field of Classification Search
CPC ........ H05K 3/325; H05K 1/115; H01R 13/03; H01R 12/585
(Continued)

(56) References Cited

U.S. PATENT DOCUMENTS 5,497,546 A * 3/1996 Kubo .................... H01L 21/486
219/85.13
2001/0013535 A1 8/2001 Miyake et al.
(Continued)

FOREIGN PATENT DOCUMENTS

EP 2 557 633 A1 2/2013
JP 2008-294299 A 12/2008
(Continued)

OTHER PUBLICATIONS

Toshiaki Morita et al., "Lead and Precious Metals Free Bonding Technique for High Temperature Environment Using Copper Oxide Materals", Presented by T. Morita et al. at the Spring Conference of the 26th Japan Institute of Electronics Packaging, pp. 308-309, Mar. 2012. (and English translation).

*Primary Examiner* — Sherman Ng
(74) *Attorney, Agent, or Firm* — Posz Law Group, PLC (57) ABSTRACT

An electronic apparatus includes a connection target member that has a first connection portion including copper or copper alloy, a connection terminal that has a second connection portion including copper or copper alloy, the second connection portion mechanically connecting with the first connection portion by spring reaction force of the connection terminal, and a joint portion that is provided with a contact point between the first connection portion and the second connection portion. At least one of the first connection portion and the second connection portion includes an oxide film at a periphery of the joint portion on a surface thereof, the oxide film including copper oxide. The joint portion directly joints copper included in the first connection portion and copper included in the second connection portion metallurgically.

10 Claims, 6 Drawing Sheets

(51) Int. Cl.
    *H01R 13/03* (2006.01)
    *H05K 3/30* (2006.01)
    *H01R 12/58* (2011.01)

(52) U.S. Cl.
    CPC .. *H01R 12/585* (2013.01); *H05K 2201/10295* (2013.01); *H05K 2203/1157* (2013.01); *H05K 2203/1189* (2013.01)

(58) Field of Classification Search
    USPC .......................................................... 174/262
    See application file for complete search history.

(56) References Cited

U.S. PATENT DOCUMENTS

| | | | |
|---|---|---|---|
| 2001/0042780 | A1 | 11/2001 | Miyake et al. |
| 2003/0205610 | A1 | 11/2003 | Miyake et al. |
| 2003/0213831 | A1 | 11/2003 | Miyake et al. |
| 2013/0034976 | A1* | 2/2013 | Tonosaki ............... H01R 13/03 439/84 |
| 2013/0081855 | A1 | 4/2013 | Miyake |
| 2014/0299982 | A1* | 10/2014 | Minamio .............. H01L 25/162 257/712 |

FOREIGN PATENT DOCUMENTS

| | | | |
|---|---|---|---|
| JP | 2012-038790 A | 2/2012 | |
| JP | 2015-48491 A | 3/2015 | |

\* cited by examiner

|  | EX. 1 | EX. 2 | EX. 3 | EX. 4 | EX. 5 | EX. 6 |
|---|---|---|---|---|---|---|
| REDN RATE | 61.2% | 73.2% | 10.0% | 26.4% | 40.3% | 12.4% |

|  | EX. 7 | EX. 8 | EX. 9 | EX. 10 |
|---|---|---|---|---|
| REDN RATE | 4.0% | 7.0% | 13.0% | 18.0% |

ELECTRONIC APPARATUS AND MANUFACTURING METHOD OF ELECTRONIC APPARATUS

CROSS REFERENCE TO RELATED APPLICATIONS

This application is based on Japanese Patent Application No. 2015-130169 filed on Jun. 29, 2015 and Japanese Patent Application No. 2015-238690 filed on Dec. 7, 2015, the disclosures of which are incorporated herein by reference.

TECHNICAL FIELD

The present disclosure relates to an electronic apparatus that has a connection target member including a first connection portion, a connection terminal including a second connection portion, the second connection portion being mechanically connected with the first connection portion by spring reaction force of the connection terminal, and a joint portion formed with including a contact point of the first connection portion and the second connection portion. The present disclosure also related to a manufacturing method of the electronic apparatus.

BACKGROUND

Patent literature 1: JP 2008-294299 A

For example, a press fit terminal has been known as a terminal (also referred to as a connection terminal) having spring property. It is supposed that a substrate, which is a connection target member, is connected with the press fit terminal. The press fit terminal has a greater width than a diameter of a through hole of the substrate. The press fit terminal is press fitted into the through hole of the substrate. And, by reaction force (referred to as spring reaction force) by elastic deformation of the terminal, the connection between the press fit terminal and the substrate is maintained. A wall surface of the through hole has a first connection portion including a plating film. A second connection portion of the press fit terminal contacts with the first connection portion under a pressurizing state according to the reaction force. That is, the second connection portion crimps the first connection portion. Thus, the first connection portion and the second connection portion are mechanically connected. Accordingly, the first connection portion and the second connection portion are electrically connected.

The connection between the press fit terminal and the substrate is required to have connection strength (a retention power) in order to endure external force such as a vehicle vibration and to maintain a contact state between the first connection portion and the second connection portion. However, the connection strength may decrease with variation of friction coefficient of a contact point between the first connection portion and the second connection portion. The press fit terminal may fall out according to the external force.

In order to increase the connection strength, the diameter of the through hole may be reduced, for example. Accordingly, the spring reaction force of the press fit terminal may increase. However, when the first connection portion and the second connection portion are connected mechanically, a damage given to the first connection portion and the second connection portion may enlarge, so that connection reliability may fall down. It may be difficult that sufficient connection strength is assured and damage at the time of mechanical connection is suppressed.

Patent literature 1 discloses an electronic apparatus that has a substrate including a first connection portion formed at a wall surface of a through hole and a plating film including copper as the first connection portion, and a press fit terminal including a second connection portion including copper or copper alloy. The second connection portion has a base material that includes copper or copper alloy as a constituent material, and a plating film formed as a constituent material of tin on the surface of the base material. In the electronic apparatus, a diffusion phenomenon of copper and tin is generated between the both plating films by heat of a core layer configuring the substrate under mechanical connection state. Thus, a diffusion joining is performed between the first connection portion and the second connection portion. Therefore, the electronic apparatus includes a joint portion formed with including a contact point of the first connection portion and the second connection portion.

The inventor of the present disclosure has found the following.

In the electronic apparatus of patent literature 1, the joint portion of the first connection portion in the substrate and the second connection portion in the press fit terminal has the following structure: a base material (copper) of the press fit terminal; a plating film (tin); a copper tin alloy; and a plating film (copper) of the substrate, in this order. The plating film (tin) formed on the surface of the base material and the alloy layer (the copper tin alloy layer) formed by the diffusion joining may have a shorter fatigue life than copper configuring the plating film of the first connection portion and the base material of the second connection portion. Therefore, when external force is repeatedly added to the joint portion, the fatigue life of the joint portion may shorten.

SUMMARY

It is an object of the present disclosure to provide an electronic apparatus that secures connection strength and suppresses damage in mechanical connection, and that improves fatigue life of a joint portion. It is also an object of the present disclosure to provide a manufacturing method of the electronic apparatus.

According to one aspect of the present disclosure, an electronic apparatus comprises: a connection target member that has a first connection portion including copper or copper alloy; a connection terminal that has a second connection portion including copper or copper alloy, the second connection portion mechanically connecting with the first connection portion by spring reaction force of the connection terminal; and a joint portion that is provided with a contact point between the first connection portion and the second connection portion, is provided. At least one of the first connection portion and the second connection portion includes an oxide film at a periphery of the joint portion on a surface thereof, the oxide film including copper oxide. The joint portion directly joints copper included in the first connection portion and copper included in the second connection portion metallurgically.

According to the electronic apparatus, copper of the substrate configuring the first connection portion and copper of the connection terminal configuring the second connection portion are directly jointed metallurgically. The joint portion is configured only from copper. Since there is no fatigue life reduction layer such as tin, copper tin alloy layer in the joint portion, it may be possible to improve the fatigue life of the joint portion as compared with a conventional technology.

Since the first connection portion of the substrate and the second connection portion of the terminal are joined metallurgically, it may be possible to assure the connection strength (a retention power) according to joining. It may be possible to weaken the spring reaction force of the terminal, since it may be possible to secure the connection strength by the joining. Therefore, at the time of a mechanical connection, it may be possible to suppress damage of the first connection portion and the second connection portion.

According to another aspect of the present disclosure, a manufacturing method of electronic apparatus comprises: preparing (i) a connection target member that has a first connection portion including copper or copper alloy, and (ii) a connection terminal that has a spring property and has a second connection portion including copper or copper alloy; providing an oxide film including copper oxide on a surface of at least one of the first connection portion and the second connection portion, the oxide film being a part of the at least one of the first connection portion and the second connection portion; applying a reductant agent, which reduces the copper oxide, to the surface of the oxide film; after the applying, connecting the first connection portion and the second connection portion by spring reaction force of the connection terminal, mechanically; and after the connecting, jointing copper included in the first connection portion and copper included in the second connection portion at an region including a contact point between the first connection portion and the second connection portion, directly and metallurgically to make a joint portion.

Accordingly, after mechanical connection, copper oxide is reduced, and the first connection portion of the substrate and the second connection portion of the terminal are joined metallurgically. Due to the joining metallurgically, it may be possible to secure the connection strength (the retention power). It may be possible to weaken the spring reaction force of the terminal, since it may be possible to secure the connection strength by the joining. Therefore, at the time of the mechanical connection, it may be possible to suppress damage of the first connection portion and the second connection portion.

Regarding oxide film formed on the surface of the first connection portion, copper generated by reduction also configures the first connection portion when copper oxide is reduced to cupper by a reductant agent. Similarly, regarding an oxide film formed on the surface of the second connection portion, copper generated by reduction also configures the second connection portion when copper oxide is reduced to cupper by the reductant agent. Therefore, due to the reduction, it may be possible to directly joint the copper configuring the first connection portion and the copper configuring the second connection portion metallurgically. Accordingly, the first connection portion of the substrate and the second connection portion of the terminal are integrally coupled only with copper. The joint portion is only configured from copper. Since there is no fatigue life reduction layer such as tin, copper tin alloy layer, in the joint portion, it may be possible to improve the fatigue life of the joint portion as compared with a conventional technology.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Hereinafter, embodiments of the present disclosure will be described referring to the drawings. Incidentally, identical symbols will be given to identical elements or associated elements in each embodiment. A thickness direction of substrates 11, 12 is defined as a Z direction, one direction orthogonal to the Z direction is defined as an X direction, and a direction orthogonal to both of the Z direction and the X direction is defined as a Y direction.

First Embodiment

A schematic configuration of an electronic apparatus according to the present embodiment will be explained referring to FIG. 1.

Figure 1:
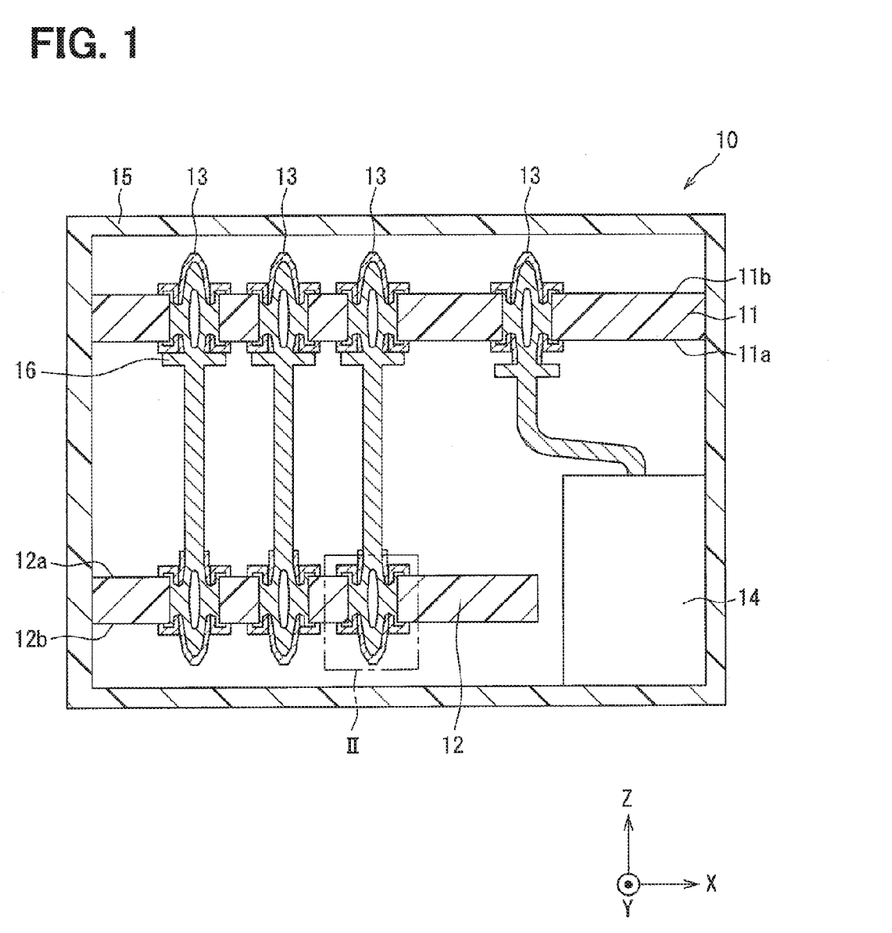
FIG. 1 is a sectional view illustrating a schematic configuration of an electronic apparatus of a first embodiment.

The electronic apparatus 10 illustrated in FIG. 1 is mounted to a vehicle. The electronic apparatus 10 shows an electronic control apparatus controlling the vehicle. The electronic apparatus 10 represents an engine electronic control unit (ECU) that controls an engine mounted to the vehicle, for example.

The electronic apparatus 10 includes a substrate having a through hole, and a press fit terminal which is inserted into the through hole at least. Incidentally, the substrate represents a wiring substrate, a printed circuit board, or the like. Two substrates are shown in the present embodiments, as an example. The number of substrates is not particularly limited. The electronic apparatus 10 of the present embodiment includes substrates 11, 12, press fit terminals 13, an electronic component 14 mounted to the substrate 11, and a housing 15. The housing 15 houses the substrates 11, 12, the press fit terminal 13, and the electronic component 14. The housing 15 has, for example, resin or metal as a constituent material. The substrates 11, 12 correspond to a connection target member. The press fit terminal 13 corresponds to a connection terminal (also referred to as a terminal). The connection target member is also referred to as a to-be-connected member or a member to be connected.

A part of the multiple press fit terminals 13 electrically connects the substrate 11 and the substrate 12. The substrate 11 may be referred to as a first substrate, and the substrate 12 may be referred to as a second substrate. Thus, a part of the press fit terminal 13 electrically connects (relays) the first substrate and the second substrate. In other words, the part of the press fit terminal 13 electrically relays the substrate 11 and the substrate 12. The press fit terminal 13 is extendedly placed along the Z direction. The end of the press fit terminal 13 has a beam part 30d. Both ends of the press fit terminal 13 have the beam part 30d. The multiple press fit terminals 13 electrically connect the substrates 11, 12, and the multiple press fit terminals 13 are arranged along the X direction.

The remaining of the multiple press fit terminals 13 electrically connects the electronic component 14 and the substrate 11. The remaining of the multiple press fit terminals 13 function as an external connection terminal of the electronic component 14. The external connection terminal of the electronic component 14 may be referred to as a lead. In addition to the above described configuration, the press fit terminal 13 may be adopted as a terminal of a connector.

Each of the press fit terminals 13 includes a widening portion 16. The widening portion 16 corresponds to a portion being wide in one direction orthogonal to the Z direction as compared to the other portion of the press fit terminal 13. The widening portion 16 of the present embodiment is the portion being wide in the X direction. The widening portion 16 is provided in the vicinity of a connection portion with the substrate 11 in the Z direction.

The press fit terminal 13 is connected to the substrates 11, 12 in the following manner, for example. By impressing external force to the widening portion 16 initially, the press fit terminal 13 is press fitted into the through hole 20 of the substrate 11 from a side of a first surface 11a of the substrate 11. After press fitting into the substrate 11, by impressing external force to a back surface 11b, the press fit terminal 13 is press fitted to the through hole 20 of the substrate 12 from a side of a first surface 12a of the substrate 12. The back surface 11b is the opposite side of the first surface 11a of the substrate 11. Accordingly, the substrate 11 and the substrate 12 are electrically connected through the press fit terminal 13.

The widening portion 16 contacts and stops at the first surface 11a of the substrate 11 when the press fit terminal 13 is press fitted into the through hole 20 of the substrate 12. Thus, when the press fit terminal 13 is press fitted into the through hole 20 of the substrate 12 before a joint portion 40 is formed between the press fit terminal 13 and the substrate 11, it may be possible to prevent the pressure contact state from being released for the substrate 11 with respect to the press fit terminal 13.

A connection structure between the substrate 12 and the press fit terminal 13 in the electronic apparatus 10 will be explained with reference to FIG. 2. Incidentally, although the connection structure between the press fit terminal 13 and the substrate 12 will be explained, a connection structure between the press fit terminal 13 and the substrate 11 is similar to the connection structure between the press fit terminal 13 and the substrate 12.

The substrate 12 includes a through hole 20 and a first connection portion 22. The first connection portion 22 is provided to a wall surface 21 of the through hole 20. The through hole 20 is provided along the Z direction with respect to the substrate 12. The through hole 20 opens to a first surface 12a and a back surface 12b. The back surface 12b is an opposite side of the first surface 12a. The through hole 20 is formed for each of the press fit terminals 13.

The first connection portion 22 is formed on a surface including the wall surface 21 of the through hole 20. The first connection portion 22 is configured to include copper or copper alloy. The first connection portion 22 in the substrate 12 is a connection portion to the press fit terminal 13. The first connection portion 22 may provide an electrical connection function in the substrate 12. In this case, the first connection portion 22 may also be referred to as a land. By contrast, the first connection portion 22 may not provide the electrical connection function. In this case, the first connection portion 22 may be referred to as a dummy land. In the present embodiment, in order to electrically connect the substrates 11, 12 mutually, the first connection portion 22 is provided as the land. The first connection portion 22 is integrally formed on, in addition to the wall surface 21, periphery of the through hole 20 in the first surface 12a and the back surface 12b.

The first connection portion 22 includes a plating film 23 and a first oxide film 24. The plating film 23 includes copper as a constituent material. The plating film 23 is provided by performing electrolytic copper plating after electroless copper plating, for example. The plating film 23 may also be referred to as a through hole plating. The plating film 23 is formed in the wall surface 21 in the through hole 20. Furthermore, in the present embodiment, the plating film 23 is integrally provided to the periphery region of the through hole 20 in the first surface 12a and the back surface 12b.

The first oxide film 24 is formed on the surface of the plating film 23. That is, the first connection portion 22 includes the first oxide film 24 on the surface of itself. The first oxide film 24 includes cupric oxide (CuO) as a constituent material. The first oxide film 24 corresponds to an oxide film of the present disclosure. The first oxide film 24 is formed on the periphery around the joint portion 40 between the substrate 12 and the press fit terminal 13. The first oxide film 24 is formed adjacent to the joint portion 40. The first oxide film 24 is provided to a portion except for the joint portion 40, among the surface of the plating film 23.

The press fit terminal 13 is press fitted and held into the through hole 20 of the substrate 12. The press fit terminal 13 has a base material 30 and a second oxide film 31. The base material 30 includes copper or copper alloy as a constituent material. Copper alloy may represent phosphor bronze, for example.

The press fit terminal 13 is a plate shape body that is formed by punching a metal plate of copper or a copper alloy. The press fit terminal 13 has an opening 30a that is formed including a part to be held in the through hole 20. Incidentally, a plate thickness direction of the press fit terminal 13 corresponds to the direction of Y. The opening 30a penetrates in the Y direction. The opening 30a extends to the Z direction, that is, a longitudinal direction of the press fit terminal 13. The opening 30a is formed so that the length of the opening 30a is a little longer than a length of the through hole 20, for example. The press fit terminal 13 includes a tip end part 30b, a rear end part 30c, and a beam part 30d, in addition to the opening 30a.

The tip end part 30b corresponds to a part of an insertion tip end side to the through hole 20 than the opening 30a. The width of the tip end part 30b, that is, the length of the X direction is narrower than the inner diameter of the through hole 20. The tip end part 30b corresponds to the part leading the press fit terminal 13 into the through hole 20. Thus, the tip end part 30b may be referred to as a guide part. The rear end part 30c is a part corresponding to a rear side than the opening 30a. The opening 30a is arranged between the tip end part 30b and the rear end part 30c in the Z direction. The rear end part 30c is coupled to a part that connects a connection part of the substrate 11 and another connection part of the substrate 12 in the press fit terminal 13.

The press fit terminal 13 branches into a pair of beam parts 30d by the opening 30a. The tip end part 30b connects two ends of the pair of the beam part 30d. The rear end part 30c connects other two ends of the pair of the beam part 30d. In the X direction, the length of a part with the longest distance among external surface of the pair of the beam part 30d before being press fitted is wider than the internal diameter of the through hole 20. The length of a part with the longest distance among external surface of the pair of the beam part 30d before being press may be referred to as a terminal width in the X direction. In other words, the terminal width is wider than the internal diameter of the through hole 20. The length of the longest exteral periphery of the terminal in the X direction is greater than the internal diameter of the through hole 20. Under press fitting, each of the pair of the beam part 30d deforms to approach to each other, so that a reaction force due to elastic deformation of the beam parts 30d works on the wall surface 21. In this way, before forming the joint portion 40, it is possible to hold the press fit terminal 13 to the substrate 12. As described above, the press fit terminal 13 has a spring property.

The terminal width in the pair of the beam parts 30d gradually widen toward the tip end part 30b from the rear end part 30c to a middle portion, and then the terminal width gradually narrow toward the tip end part 30b from the middle portion. In the electronic apparatus 10, at least a part placed into the through hole 20 of the beam part 30d configures the joint portion 40.

The second oxide film 31 is formed on the surface of the base material 30. The press fit terminal 13 has the second oxide film 31 at the surface thereof. The second oxide film 31 includes cupric oxide as a constituent material. The second oxide film 31 also corresponds to the oxide film of the present disclosure. The second oxide film 31 in the electronic apparatus 10 is formed around the joint portion 40. The second oxide film 31 is formed adjacent to the joint portion 40. The second oxide film 31 is formed at the external surface of at least the beam part 30d in the surface of the base material 30, except for the joint portion 40. In the present embodiment, the second oxide film 31 is formed on the tip end parts 30b and the rear end part 30c, in addition to the beam part 30d. Incidentally, the second oxide film 31 may be formed on the internal surface of the beam part 30d, that is, the surface of the opening 30a.

The press fit terminal 13 has a second connection portion 32. The second connection portion 32 mechanically connects with the first connection portion 22 of the substrate 12 by the spring reaction force of the press fit terminal 13. The second connection portion 32 includes copper or copper alloy. The second connection portion 32 is configured by a part forming the joint portion 40 and its peripheral part among the base material 30 and the second oxide film 31. For example, the part placed in the through hole 20 configures the second connection portion 32.

Under press fitting, the joint portion 40 is formed between the substrate 12 and the press fit terminal 13. The joint portion 40 is configured by directly and metallurgically jointing the copper configuring the first connection portion 22 of the substrate 12, and the copper configuring the second connection portion 32 of the press fit terminal 13. Therefore, the copper of the first connection portion 22 and the copper of the second connection portion 32 are integrated continuously. The joint portion 40 is formed including a contact point of a mechanical connection of the first connection portion 22 and the second connection portion 32.

The joint portion 40 is formed by reduction to copper of cupric oxide configuring the first oxide film 24 and the second oxide film 31. Thus, the first oxide film 24 is formed at a part except for the joint portion 40 among the surface of the plating film 23. The second oxide film 31 is formed at a part except for the joint portion 40 among the external surface of the beam part 30d of the base material 30.

Subsequently, a forming method of a connection structure, that is, a manufacturing method of the electronic apparatus 10 will be explained with reference to FIG. 3 and FIG. 4.

Initially, the substrate 12 in which the plating film 23 has been formed on the wall surface 21 of the through hole 20, and the press fit terminal 13 (only the base material 30) are prepared. And, an oxide film formation process is performed. In the oxide film formation process, an oxide film that includes cupric oxide as a constituent material is formed on at least one of the surface of the first connection portion 22 and the second connection portion 32, as a part of it.

Figure 3:
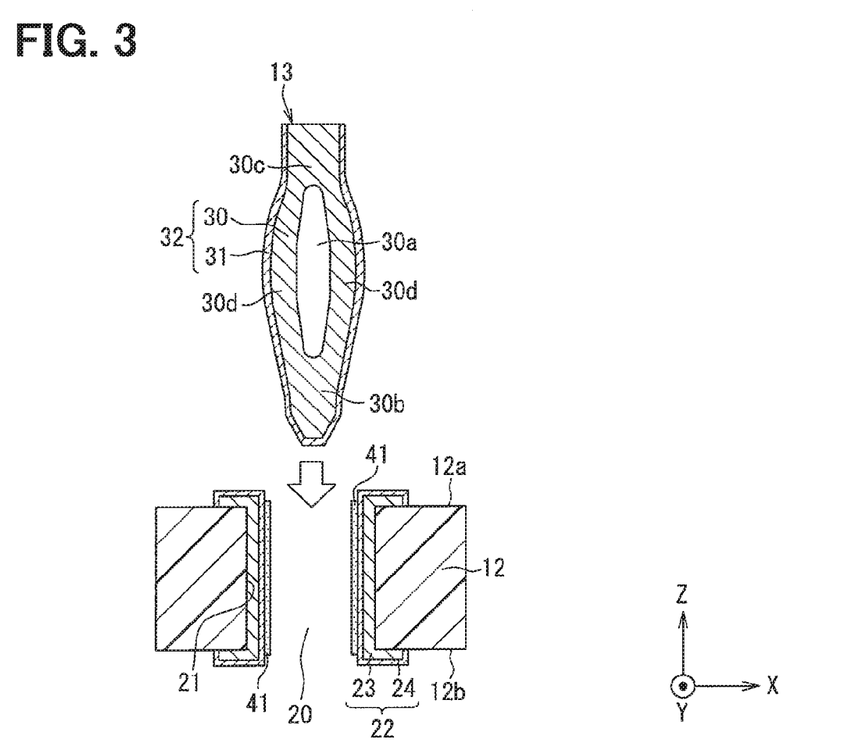
FIG. 3 is a sectional view illustrating a part of a manufacturing process of the electronic apparatus.
Figure 4:
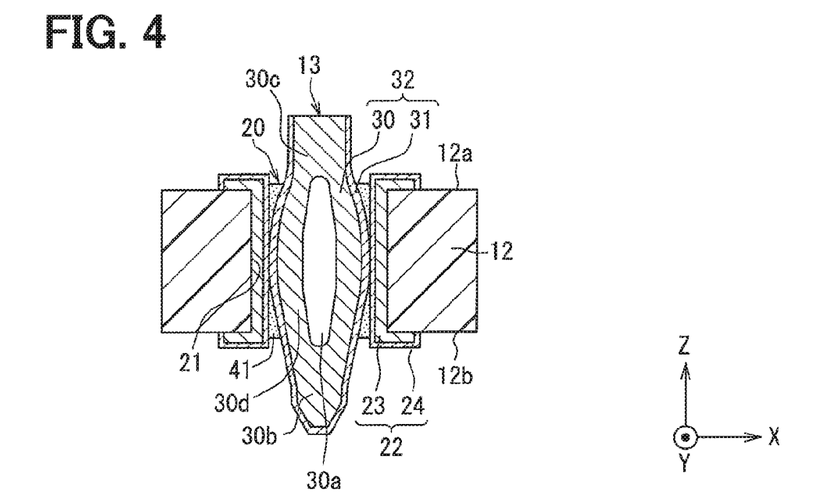
FIG. 4 is a sectional view illustrating a part of a manufacturing method of the electronic apparatus.

In the present embodiment, as illustrated in FIG. 3, the first oxide film 24 including cupric oxide as a constituent material is formed on the surface of the plating film 23. The second oxide film 31 including cupric oxide as a constituent material is formed on the surface of the base material 30. That is, the oxide film including the cupric oxide as the constituent material is formed in both of the surface of the first connection portion 22 and the surface of the second connection portion 32. Incidentally, the first oxide film 24 and the second oxide film 31 may be formed by heat (thermal oxidation), for example.

The first oxide film 24 is formed at a part to be the joint portion 40 and the periphery of it at least. For example, so that the part to be the joint portion 40 is included, the first oxide film 24 may be formed at a part that is placed into the through hole 20 among the surface of the plating film 23. In the present embodiment, the first oxide film 24 is formed on the whole surface of the plating film 23. The second oxide film 31 is formed at a part to be the joint portion 40 and the periphery of it at least. Therefore, as described above, the second oxide film 31 may be formed at the part to be placed into the through hole 20. In the present embodiment, the second oxide film 31 is formed on the whole surface toward the tip end from the rear end part 30c including the rear end part 30c in the base material 30. That is, the second oxide film 31 is formed on the whole surface of the tip end part 30b and the rear end part 30c and the whole of the external surface of the beam part 30d.

And, an application process (also referred to as a coating process) is performed. In the application process, a reductant agent that reduces cupric oxide is applied on the formed oxide film.

The reductant agent may be applied on at least one of the surface of the first oxide film 24 and the surface of the second oxide film 31. In the present embodiment, as described in FIG. 3, the reductant 41 is applied to the surface of the first oxide film 24. The reductant 41 is dissolved into solvent such as water, ethanol, to made liquid solution. The solution is applied to the surface of the first oxide film 24. As an application method, dipping coating, spray coating, dispenser coating or the like may be used. When the reductant 41 itself is liquid, a solvent may be used as necessary so as to perform coating. An application position of the reductant 41 is determined so as to include the part to be the joint portion 40. In the present embodiment, the reductant 41 is applied to the part within at least the through hole 20, which corresponds to the surface of the first oxide film 24.

As the reductant 41, any material that can reduce cupric oxide, that is, the constituent material of the first oxide film 24 and the second oxide film 31 may be used. Preferably, at least one of the L-ascorbic acid, D-araboascorbic acid, acetaldehyde 2,4-dinitrophenylhydrazone, 4-hydrazinobenzoic-acid, diethylhydroxylamine, and 1,3-dihydroxyacetone-dimer may be used. Reduction ability of the reductant 41 exemplified here to the cupric oxide (CuO) is checked by the inventor of the present disclosure.

A press fit process is performed. The press fit process corresponds to a connection process that mechanically connects the first connection portion 22 and the second connection portion 32. In the press fit process, as illustrated in FIG. 4, the press fit terminal 13 is press fitted into the through hole 20. At this time, the tip end part 30b as an insertion tip end is inserted into the through hole 20 from a side of the first surface 12a of the substrate 12. As described above, since the terminal width is wider than the inside diameter of the through hole 20, when the beam part 30d is inserted into the through hole 20, the pair of the beam parts 30d deform so as to approach mutually. The reaction force by the elastic deformation of the beam parts 30d, that is, spring reaction force works on the wall surface 21 through the first connection portion 22. By the spring reaction force, the press fit terminal 13 is contacted (pressure welded) in a pressurized state on the wall surface 21. That is, the first connection portion 22 and the second connection portion 32 are connected mechanically. It may be preferable that the reductant 41 intervenes between the contact point of the first connection portion 22 and the second connection portion 32 under the pressure welding state. However, when the reductant 41 exists around at least the contact point, joining is possible.

Subsequently, a joining process is performed. In the joining process, under the press fitting state, while reducing cupric oxide configuring the oxide film to cupper by the reductant 41, copper configuring the first connection portion 22 and copper configuring the second connection portion 32 are directly jointed metallurgically to generate the joint portion 40. The joint portion 40 is formed while reducing the cupric oxide of the first oxide film 24 and the cupric oxide of the second oxide film 31 to cupper in the present embodiment.

The reduced part of the first oxide film 24 and the second oxide film 31 becomes copper. Thus, the surface of the copper configuring the first connection portion 22 and the surface of the copper configuring the second connection portion 32 approach mutually according to the mount of copper which has been reduced, and atomic force between the surfaces works, so that the joint portion 40 is formed. A metallurgical joint represents a joint which occurs due to atomic force by approaching copper atoms while reducing cupric oxide. The joint portion 40 is formed by directly jointing the copper configuring the first connection portion 22 and the copper configuring the second connection portion 32 without intervening a joint member such as solder or the like.

When the reductant 41, which is exemplified, is used, it may be possible to reduce cupric oxide to cupper and form the joint portion 40 by leaving the first connection portion 22 and the second connection portion 32 for a predetermined period of time at an ordinary temperature (for example, 25° C.). Therefore, the connection structure illustrated in FIG. 2 is obtained. It should be noticed that heating may be performed when the joint portion 40 is formed.

An effect of the electronic apparatus 10 according to the present embodiment will be explained.

In the present embodiment, after press fitting, the first connection portion 22 in each of the substrates 11, 12 and the second connection portion 32 in the press fit terminal 13 are jointed metallurgically by reduction. According to the metallurgical joint, it may be possible to secure connection strength (retention force). And, since the connection strength is secured by the joint, it may be possible to weaken the spring reaction force of the press fit terminal 13. Therefore, it may be possible to suppress damage of the first connection portion 22 and the second connection portion 32 at the time of press fitting. For example, it may be possible to suppress damage of the plating film 23 of the substrates 11, 12.

The cupper of the first connection portion 22 of the substrates 11, 12 and the copper of the second connection portion 32 of the press fit terminal 13 are directly jointed metallurgically while reducing cupric oxide to cupper with the reductant 41. Thus, the first connection portion 22 and the second connection portion 32 are continued integrally only by copper. In other words, the joint portion 40 is configured only by copper. Since a fatigue life deterioration layer such as tin, copper tin alloy or the like does not exist in the joint portion 40, it may be possible to improve fatigue life of the joint portion 40 as compared to a conventional technology.

In the present embodiment, cupric oxide is reduced to cupper by the reductant 41 at an ordinary temperature. That is, after press fitting, being left it under the ordinary temperature, it may be possible to form the joint portion 40. Since heating may be unnecessary, it may be possible to reduce a manufacturing cost. Furthermore, when the reductant 41 is dissolved into a solvent and the solvent is applied, the solvent is less likely to volatilize at the ordinary temperature. Thus, a reduction may easily progress.

Incidentally, an example in which an oxide film (the first oxide film 24 and the second oxide film 31) is formed on both of the surface of the first connection portion 22 and the surface of the second connection portion 32 is illustrated. However, the oxide film may be formed on either one of the surface of the first connection portion 22 or the surface of the second connection portion 32. That is, at least one of the first oxide film 24 and the second oxide film 31 may be formed as the oxide film. For example, when only the first oxide film 24 is formed, the reductant 41 is applied to the surface of the first oxide film 24. When both of the first oxide film 24 and the second oxide film 31 are formed, the reductant 41 may be applied to at least one of the surface of the first oxide film 24 and the surface of the second oxide film 31.

Hereinafter, a specific example checked by the inventor of the present disclosure will be described.

EXAMPLES

The reductant agent is dissolved into a solvent (water, ethanol, hexane, or pseudocumene) to make a solution. Cupric oxide powder is thrown into the solution, and mixed it. The solution was left at an ordinary temperature (25° C.) for a whole day and night (24 hours). A filtration under reduced pressure of the solution after leaving for a whole day and night was performed, and a qualitative analysis of a sample obtained by the filtration was conducted by EPMA (an electron probe micro analyzer). A reduction rate was calculated from the analyses result. The reduction rate was calculated with the following expression.

Reduction rate=100−{(oxygen amount of the sample (%)/oxygen amount of CuO (%))*100}  (Expression 1)

At the time of the analysis, the above check was performed for each of the six kinds of the reductant 41. Hereinafter, an example using L-ascorbic acid will be described as a first example, another example using D-araboascorbic acid will be described as a second example, another example using acetaldehyde 2,4-dinitrophenylhydrazone will be described as a third example, another example using 4-hydrazinobenzoic-acid will be described as a fourth example, another example using diethylhydroxylamine will be described as a fifth example, and another example using 1,3-dihydroxyacetone-dimer will be described as a sixth example.

Figure 5:
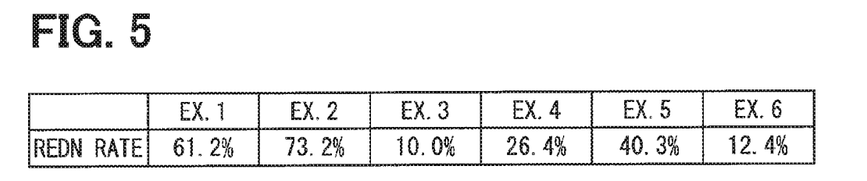
FIG. 5 is a diagram showing a reduction rate of first to sixth examples.

As illustrated in FIG. 5, in each of the first to sixth examples, it is confirmed that cupric oxide (CuO) is reduced to copper at the ordinary temperature. Especially, L-ascorbic acid illustrated in the first example and D-araboascorbic acid illustrated in the second example shows a remarkable effect. Thus, it is shown that, when the reductant 41 illustrated in the first to sixth examples is used, cupric oxide configuring the first oxide film 24 and the second oxide film 31 is reduced to cupper at the ordinary temperature, and the copper configuring the first connection portion 22 and the copper configuring the second connection portion 32 is directly jointed metallurgically.

Figure 6:
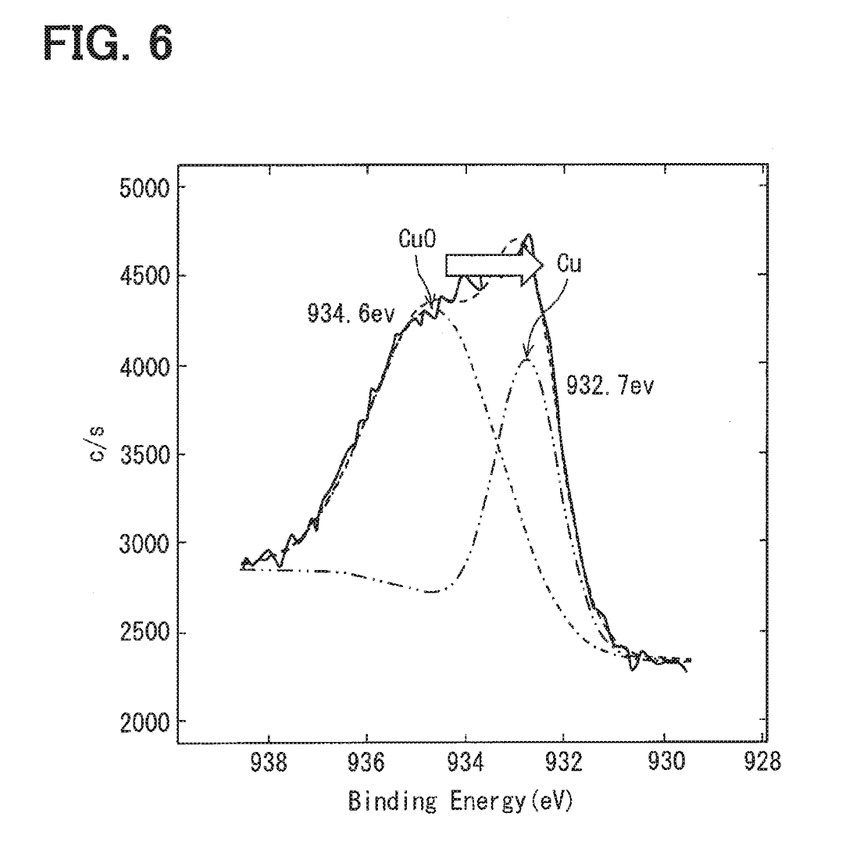
FIG. 6 is a diagram illustrating a measured result of X-ray photoelectron spectroscopy of the first example.

Incidentally, regarding the first example (L-ascorbic acid), another check was also performed with XPS (X-ray photoelectron spectroscopy). FIG. 6 shows a measurement result of XPS. The vertical axis illustrates the number of counts of photoelectron per second. The horizontal axis illustrates binding energy. In FIG. 6, a solid line illustrates the measurement result of the sample after the filtration. A broken line illustrates an approximate line based on the measurement result. A dot chain line illustrates a first peak estimated from the approximate line. A two-dot chain line illustrates a second peak estimated from the approximate line.

As illustrated in FIG. 6, two shoulders were checked in the measurement result (and the approximate line). The binding energy of the first peak, which is one of the two shoulders, illustrates 934.6 eV, and this agrees with cupric oxide. The binding energy of the second peak, which is the other of the two shoulders, illustrates 932.7 eV, and this agrees with copper. Thus, the reduction of the cupric oxide by L-ascorbic acid was checked by XPS. Thus, by reducing cupric oxide configuring the first oxide film 24 and the second oxide film 31 at the ordinary temperature, copper configuring the first connection portion 22 and the copper configuring the second connection portion 32 is directly jointed metallurgically.

Second Embodiment

The second embodiment references the precedent embodiment. Thus, a description in common with the electronic apparatus 10 and the manufacturing method of it in the first embodiment will be omitted.

Figure 7:
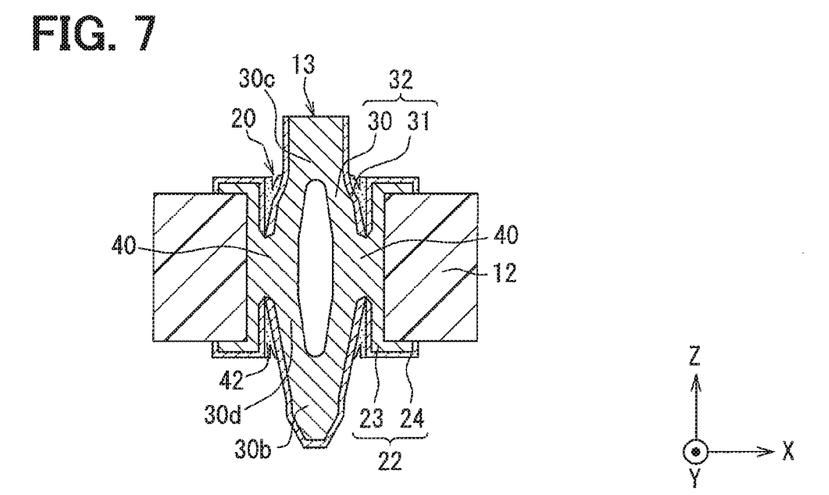
FIG. 7 is a sectional view illustrating a joint portion and a periphery of the joint portion in an electronic apparatus according to a second embodiment and corresponding to FIG. 2.

The electronic apparatus 10 in the present embodiment further includes a reduction film 42 which includes the reductant 41 as a constituent material, as described in FIG. 7. The reduction film 42 corresponds to at least one of the surface of the first oxide film 24 and the surface of the second oxide film 31. The reduction film 42 is formed around the joint portion 40. The reduction film 42 is formed at least around the joint portion 40. The reduction film 42 is formed adjacent to the joint portion 40.

An example in FIG. 7 illustrates that the reduction film 42 is formed on both of the surface of the first oxide film 24 and the surface of the second oxide film 31. The reduction is formed so as to surround the joint portion 40.

The reduction film 42 may be formed by the reductant 41 which has remained around the joint portion 40 due to application of the extra reductant 41 in the application process. Alternatively, after forming the joint portion 40, the reduction film 42 may be newly formed by, for example, a spray coating.

According to this configuration, it may be possible to suppress cupper of the joint portion 40 from being oxidized by oxygen in the external atmosphere (the air). Accordingly, it is possible to prevent electrical resistance from increasing.

Incidentally, the reduction film 42 may be formed around the joint portion 40 and formed on the surface of the oxide film. For example, when the electronic apparatus 10 includes only the first oxide film 24 as the oxide film, the reduction film 42 may be formed around the joint portion 40, being the surface of the first oxide film 24.

Third Embodiment

The third embodiment references the precedent embodiments. Thus, a configuration in common with the electronic apparatus 10 and the manufacturing method of it in the precedent embodiments will be omitted.

Figure 2:
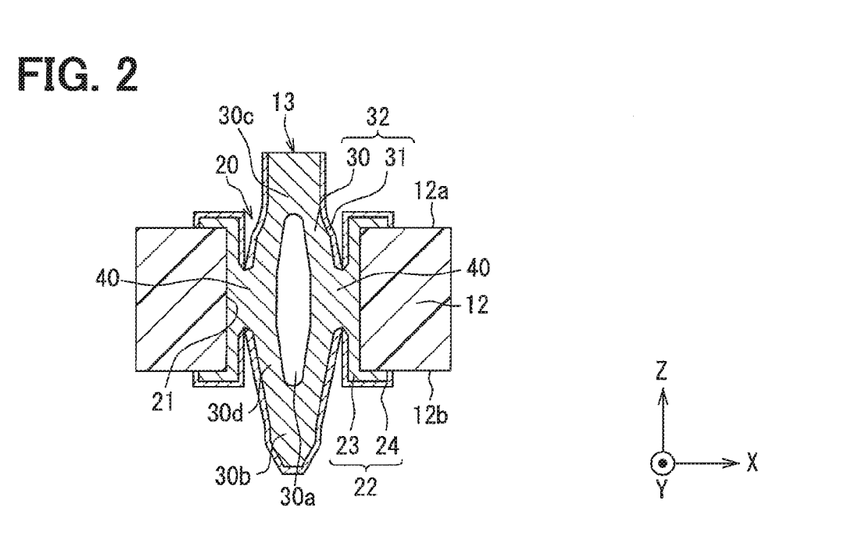
FIG. 2 is an enlarged view illustrating an area II in FIG. 1.

The electronic apparatus 10 in the present embodiment includes a configuration similar to the electronic apparatus 10 of the precedent embodiments (referring to FIG. 1 and FIG. 2). And, the electronic apparatus 10 in the present embodiment is formed by the similar manufacturing method of the electronic apparatus 10 in the precedent embodiments. In the precedent embodiments, the constituent material of the oxide film (that is, the first oxide film 24 and the second oxide film 31) is cupric oxide. Instead, in the present embodiment, the constituent material of the oxide film is cuprous oxide ($Cu_2O$). Cuprous oxide is formed, for example, by thermal oxidation at a temperature lower than a temperature in thermal oxidation for forming cupric oxide.

As the reductant 41, a material that reduces cuprous oxide can be used. Preferably, the reductant 41 may be at least one of cyclooctane, dicyclopentadiene, triphenylmethane, and 1,4-dihydro-naphthalene. Reduction ability of the reductant 41 exemplified here to cuprous oxide is checked by the inventor of the present disclosure.

Hereinafter, a specific example checked by the inventor of the present disclosure will be described.

Examples

The reductant agent was dissolved into a solvent (water, ethanol, a hexane, or pseudocumene) to make a solution. And, cuprous oxide powder was thrown into the solution, and mixed the solution. The solution was heated for 2 minutes at 300° C. A filtration under reduced pressure of the solution after heating was performed, and an analysis of a sample obtained by the filtration was conducted by a fluorescent X-ray spectrometer (XRF). A reduction rate was calculated from the analyses result.

At the time of the analysis, the above check was performed for each of the four types of the reductant 41. Hereinafter, an example using cyclooctane will be described as a seventh example, another example using dicyclopentadiene will be described as an eighth example, another example using triphenylmethane will be described as a ninth example, and another example using 1,4-dihydro-naphthalene will be described as a tenth example.

Figure 8:
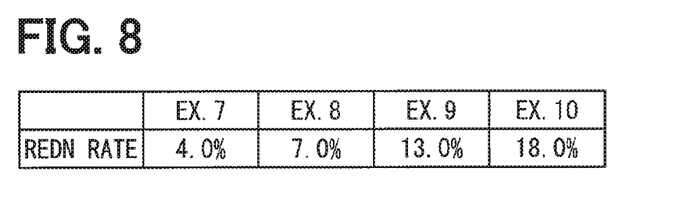
FIG. 8 is a diagram showing a reduction rate of seventh to tenth examples in an electronic apparatus according to a third embodiment.

As illustrated in FIG. 8, each of the seventh to tenth examples shows that cuprous oxide ($Cu_2O$) can be reduced to copper. Thus, it is shown that, when the reductant 41 illustrated in the seventh to tenth examples is used, cuprous oxide configuring the first oxide film 24 and the second oxide film 31 can be reduced to cupper, and the copper configuring the first connection portion 22 and the copper configuring the second connection portion 32 can be directly jointed metallurgically.

Fourth Embodiment

The fourth embodiment references the precedent embodiments. A configuration in common with the electronic apparatus 10 and the manufacturing method of it in the precedent embodiments will be omitted.

In the precedent embodiments, the connection target member corresponds to the substrates 11, 12. The connection terminal corresponds to the press fit terminal 13. However, the connection target member and the terminal are not limited to the above embodiments. Any kind of terminal that has spring property and mechanically connects a second connection portion to a first connection portion of a connection target member with spring reaction force of itself may be used. Any kind of connection target member that has the first connection portion configured to include copper or copper alloy may be used.

Figure 9:
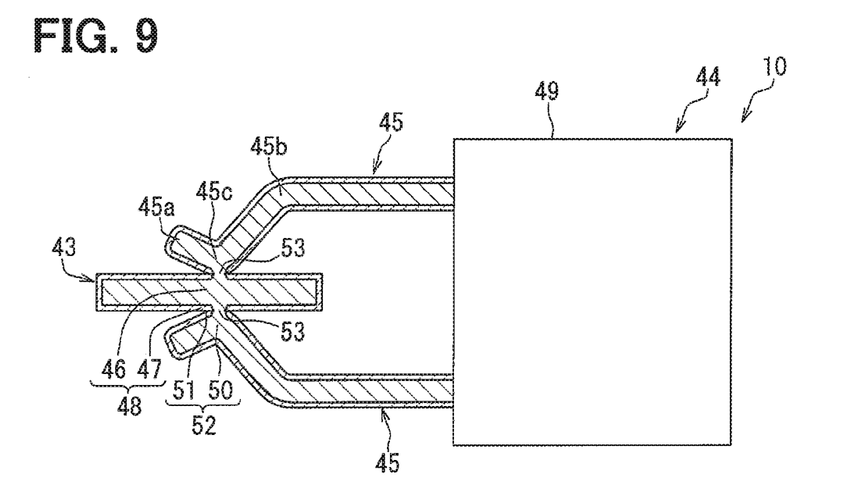
FIG. 9 is a sectional view illustrating a schematic configuration of an electronic apparatus according to a fourth embodiment.

As illustrated in FIG. 9, the electronic apparatus 10 includes a bus bar 43 as the connection target member, and an electronic component 44 having a lead terminal 45 as a terminal. The bus bar 43 includes a base material 46 which is a metal plate including copper or copper alloy as a constituent material, and a first oxide film 47 which is formed on the surface of the base material 46. The first oxide film 47 includes cupric oxide as a constituent material. The first connection portion 48 is configured by a connection part with the lead terminal 45 and its peripheral part among the base material 46 and the first oxide film 47. Thus, the first connection portion 48 includes copper or copper alloy, and includes the first oxide film 47 of its surface.

In the electronic component 44, the lead terminal 45 extends from a main body 49. The electronic component 44 has a pair of lead terminals 45. Each of the lead terminals 45 includes a base material 50 including copper or copper alloy as a constituent material, and a second oxide film 51 which is formed on the surface of the base material 50. The base material 50 may include phosphor bronze, for example. The lead terminal 45 includes a first bend part 45b and a second bend part 45c between the main body 49 and a tip end part 45a. The first bend part 45b is placed closer from the main body 49 than the second bend part 45c. The first bend part 45b is placed between the main body 49 and the second bend part 45c. The second bend part 45c is placed between the tip end part 45a and the second bend part 45c. A peak of a projection of the second bend part 45c and the periphery thereof makes a contact point with the first connection portion 48.

The first bend part 45b and the second bend part 45c are formed by bending process, for example. According to the first bend part 45b and the second bend part 45c, the tip end part 45a is separated from the bus bar 43. The lead terminal 45 can perform elastic deformation in a plate thickness direction of the bus bar 43, that is, an arranged direction of the pair of the lead terminals 45.

The pair of the lead terminals 45 holds the bus bar 43 between the second bend parts 45c with the spring reaction force thereof. Each of the lead terminals 45 includes the second connection portion 52 which mechanically connects with the first connection portion 48 of the bus bar 43. And, the joint portion 53 is formed with including a contact point of the first connection portion 48 and the second connection portion 52. The second connection portion 52 is configured to include copper or copper alloy. The second connection portion 52 is configured by a portion forming the joint portion 53 and its peripheral portion among the base material 50 and the second oxide film 51.

By reducing cupric oxide configuring the first oxide film 47 and the second oxide film 51 to copper, the copper configuring the first connection portion 48 and the copper configuring the second connection portion 52 can be directly jointed metallurgically, as similar to the joint portion 40. The joint portion 53 is formed in each of the pair of the lead terminals 45.

According to this configuration, it is possible to obtain the similar effects of the precedent embodiments. Incidentally, a connection terminal having spring property may be a turning fork terminal or a terminal in which a plate spring or a coil spring, in addition to the connection terminal described in the present embodiments.

Copper oxide configuring the first oxide film 47 and the second oxide film 51 may include cuprous oxide. Either one of the bus bar 43 or the lead terminal 45 may include an oxide film.

In the bus bar 43, a coating (for example, a plating film) including copper or copper alloy as a constituent material may be formed on the surface of the base material 46, and the first oxide film 47 may be form on the coating. In this case, the coating and the first oxide film 47 configures the first connection portion 48. In this case, the constituent material of the base material 46 is not limited to copper or copper alloy. Similarly, in the lead terminal 45, a coating (for example, a plating film) including copper or copper alloy as a constituent material may be formed on the surface of the base material 50, and the second oxide film 51 may be formed on the coating. In this case, the coating and the second oxide film 51 configures the second connection portion 52. In this case, the constituent material of the base material 50 is not limited to copper or copper alloy.

Figure 10:
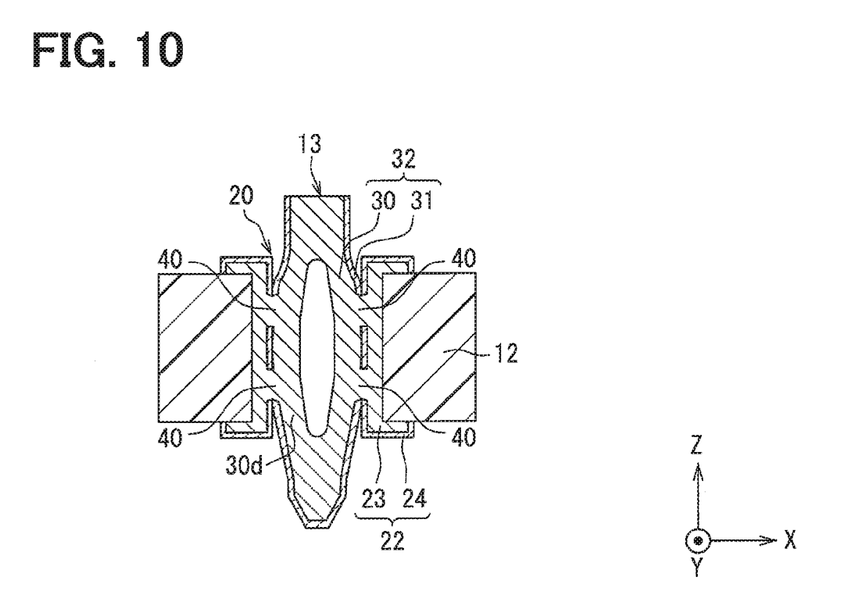
FIG. 10 is a sectional view illustrating a first modified example and corresponding to FIG. 2.

The first embodiment exemplifies that a single joint portion 40 is formed with respect to each of the beam part 30d. However, the number of the joint portions 40 is not limited to this embodiment. For example, as described in a first modified example of FIG. 10, two of the joint portions 40 may be provided with respect to each of the beam part 30d. That is, multiple joint portions 40 may be formed at multiple positions with respect to each of the beam part 30d. Similarly, multiple joint portions 53 may be formed at multiple positions.

While the embodiments, the configurations, the aspects of the electronic apparatus and the manufacturing method of the electronic apparatus have been described by way of example, it should be appreciated that embodiments, configurations, aspects of the present disclosure are not limited to the respective embodiments, the respective configurations, and the respective aspects described above. For example, embodiments, configurations, aspects obtained by appropriately combining technical portions disclosed in different embodiments, configurations, and aspects are included within a range of embodiments, configurations, and aspects of the present disclosure.

What is claimed is:

1. An electronic apparatus comprising: a connection target member that has a first connection portion including copper or copper alloy; a connection terminal that has a second connection portion including copper or copper alloy, the second connection portion mechanically connecting with the first connection portion by spring reaction force of the connection terminal; and a joint portion that is provided with a contact point between the first connection portion and the second connection portion, wherein: at least one of the first connection portion and the second connection portion includes an oxide film at a periphery of the joint portion on a surface thereof, the oxide film including copper oxide; and the joint portion directly joints copper included in the first connection portion and copper included in the second connection portion metallurgically, wherein the connection target member is provided by a substrate; the substrate has a through hole; the first connection portion is provided at a wall surface of the through hole, and includes a plating film including copper; the connection terminal is provided by a press fit terminal which is press fitted into the through hole and held in the substrate; and the joint portion is provided inside the through hole.

2. The electronic apparatus according to claim 1, further comprising:
a reduction film that includes a reductant agent to reduce the copper oxide,
wherein:
the reduction film is provided at a periphery of the joint portion on a surface of the oxide film.

3. The electronic apparatus according to claim 2, wherein:
the copper oxide is provided by cupric oxide; and
the reductant agent is provided by at least one of L-ascorbic acid, D-araboascorbic acid, acetaldehyde 2,4-dinitrophenylhydrazone, 4-hydrazinobenzoic-acid, diethylhydroxylamine, and 1,3-dihydroxyacetone-dimer.

4. The electronic apparatus according to claim 2, wherein:
the copper oxide is provided by cuprous oxide; and
the reductant agent is provided by at least one of cyclooctane, dicyclopentadiene, triphenylmethane, and 1,4-dihydro-naphthalene.

5. A manufacturing method of electronic apparatus, comprising: preparing (i) a connection target member that has a first connection portion including copper or copper alloy, and (ii) a connection terminal that has a spring property and has a second connection portion including copper or copper alloy; providing an oxide film including copper oxide on a surface of at least one of the first connection portion and the second connection portion, the oxide film being a part of the at least one of the first connection portion and the second connection portion; applying a reductant agent, which reduces the copper oxide, to the surface of the oxide film; after the applying, connecting the first connection portion and the second connection portion by spring reaction force of the connection terminal, mechanically; and after the connecting, jointing copper included in the first connection portion and copper included in the second connection portion at an region including a contact point between the first connection portion and the second connection portion, directly and metallurgically to make a joint portion, wherein the connection target member is provided by a substrate; the substrate has a through hole; the first connection portion is provided at a wall surface of the through hole, and include a plating film including copper; the connection terminal is provided by a press fit terminal; in the connecting, the press fit terminal is press fitted into the through hole so as to mechanically connect the first connection portion and the second connection portion; in the jointing, the joint portion is provided inside the through hole.

6. The manufacturing method of electronic apparatus according to claim 5, wherein:
the copper oxide is provided by cupric oxide.

7. The manufacturing method of electronic apparatus according to claim 6, wherein:
in the jointing, the reductant agent reduces cupric oxide to copper at an ordinary temperature.

8. The manufacturing method of electronic apparatus according to claim 6, wherein:
the reductant agent is provided by at least one of L-ascorbic acid, D-araboascorbic acid, acetaldehyde 2,4-dinitrophenylhydrazone, 4-hydrazinobenzoic-acid, diethylhydroxylamine, and 1,3-dihydroxyacetone-dimer.

9. The manufacturing method of electronic apparatus according to claim 5, wherein:
the copper oxide is provided by cuprous oxide; and
the reductant agent is provided by at least one of cyclooctane, dicyclopentadiene, triphenylmethane, and 1,4-dihydro-naphthalene.

10. The manufacturing method of electronic apparatus according to claim 8, wherein:
in the jointing, the reductant agent reduces cupric oxide to copper at 25 degrees Celsius for at least 24 hours.

* * * * *